(12) United States Patent
Ting et al.

(10) Patent No.: US 10,872,987 B2
(45) Date of Patent: Dec. 22, 2020

(54) ENHANCED QUANTUM EFFICIENCY BARRIER INFRARED DETECTORS

(71) Applicant: California Institute of Technology, Pasadena, CA (US)

(72) Inventors: David Z. Ting, Arcadia, CA (US); Alexander Soibel, South Pasadena, CA (US); Arezou Khoshakhlagh, Pasadena, CA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/530,294

(22) Filed: Dec. 12, 2016

(65) Prior Publication Data
US 2019/0013427 A1    Jan. 10, 2019

Related U.S. Application Data

(60) Provisional application No. 62/265,813, filed on Dec. 10, 2015.

(51) Int. Cl.
*H01L 31/0352*    (2006.01)
*H01L 31/102*    (2006.01)
(Continued)

(52) U.S. Cl.
CPC .. *H01L 31/035236* (2013.01); *H01L 27/1463* (2013.01); *H01L 27/14649* (2013.01);
(Continued)

(58) Field of Classification Search
CPC ........ H01L 31/035236; H01L 31/03046; H01L 27/14649; H01L 27/1463; H01L 31/101; H01L 31/102
See application file for complete search history.

(56) References Cited

U.S. PATENT DOCUMENTS

| | | |
|---|---|---|
| 4,679,063 A | 7/1987 | White |
| 4,843,439 A | 6/1989 | Cheng |

(Continued)

FOREIGN PATENT DOCUMENTS

| | | |
|---|---|---|
| WO | 2005004243 | 1/2005 |
| WO | 2008061141 | 5/2008 |
| WO | 2010006269 A1 | 1/2010 |

OTHER PUBLICATIONS

Ashley et al., Semicond. Sci. Technol., vol. 6, pp. C99-C105, 1991.
(Continued)

*Primary Examiner* — Ermias T Woldegeorgis
(74) *Attorney, Agent, or Firm* — KPPB LLP

(57) ABSTRACT

Barrier infrared detectors having structures configured to enhance the quantum efficiency, and methods of their manufacture are provided. In particular, device structures for constructing high-performance barrier infrared detectors using novel combinations of p-type and n-type absorber regions and contact regions are provided. The infrared detectors generally incorporate a "$p^+Bpnn^+$" structure. The detectors generally comprise, in sequence, a highly p-doped contact layer "$p^+$", an electron unipolar barrier "B", a p-type absorber section "p", and n-type absorber section "n", and a highly n-doped contact layer "$n^+$".

17 Claims, 8 Drawing Sheets

(51) Int. Cl.
*H01L 27/146* (2006.01)
*H01L 31/101* (2006.01)
*H01L 31/0304* (2006.01)

(52) U.S. Cl.
CPC ...... *H01L 31/03046* (2013.01); *H01L 31/101* (2013.01); *H01L 31/102* (2013.01)

(56) References Cited

U.S. PATENT DOCUMENTS

| | | | |
|---|---|---|---|
| 5,194,983 | A | 3/1993 | Voisin et al. |
| 5,536,948 | A | 7/1996 | Lee |
| 6,226,152 | B1 | 5/2001 | Tanaka et al. |
| 6,433,354 | B1 | 8/2002 | Kuan et al. |
| 6,455,908 | B1 | 9/2002 | Johnson et al. |
| 7,442,599 | B2 | 10/2008 | Maa et al. |
| 7,633,083 | B2 | 12/2009 | Lester et al. |
| 7,687,871 | B2 | 3/2010 | Maimon |
| 7,795,640 | B2 | 9/2010 | Klipstein |
| 7,928,473 | B2 | 4/2011 | Klipstein |
| 8,022,390 | B1 | 9/2011 | Kim et al. |
| 8,217,480 | B2 | 7/2012 | Ting et al. |
| 8,410,523 | B2 | 4/2013 | Huffaker et al. |
| 8,928,029 | B2 | 1/2015 | Ting et al. |
| 9,214,581 | B2 | 12/2015 | Khoshakhlagh et al. |
| 9,647,164 | B2 | 5/2017 | Ting et al. |
| 9,799,785 | B1 | 10/2017 | Ting et al. |
| 9,831,372 | B2 | 11/2017 | Khoshakhlagh et al. |
| 2002/0027238 | A1* | 3/2002 | Lin ............ B82Y 20/00 257/292 |
| 2003/0064248 | A1 | 4/2003 | Wolk et al. |
| 2003/0209708 | A1 | 11/2003 | Kubota |
| 2007/0215900 | A1 | 9/2007 | Maimon |
| 2007/0235758 | A1 | 10/2007 | Klipstein |
| 2008/0111152 | A1 | 5/2008 | Scott et al. |
| 2009/0084958 | A1 | 4/2009 | Vogt |
| 2009/0127462 | A1 | 5/2009 | Gunapala et al. |
| 2009/0224228 | A1 | 9/2009 | Razeghi |
| 2009/0256231 | A1 | 10/2009 | Klipstein |
| 2010/0006822 | A1 | 1/2010 | Ting et al. |
| 2010/0072514 | A1 | 3/2010 | Ting et al. |
| 2010/0155777 | A1 | 6/2010 | Hill et al. |
| 2010/0230720 | A1 | 9/2010 | Wicks |
| 2011/0037097 | A1 | 2/2011 | Scott et al. |
| 2012/0022362 | A1 | 1/2012 | Caruba et al. |
| 2012/0145996 | A1 | 6/2012 | Ting et al. |
| 2012/0199185 | A1 | 8/2012 | Yang |
| 2013/0062593 | A1 | 3/2013 | Jones et al. |
| 2013/0146998 | A1 | 6/2013 | Ting et al. |
| 2014/0225064 | A1 | 8/2014 | Khoshakhlagh et al. |
| 2014/0332755 | A1* | 11/2014 | Wei ............ H01L 31/035236 257/21 |
| 2014/0374701 | A1* | 12/2014 | Wei ............ H01L 31/03046 257/18 |
| 2015/0145091 | A1 | 5/2015 | Ting et al. |
| 2016/0336476 | A1 | 11/2016 | Khoshakhlagh et al. |

OTHER PUBLICATIONS

Klipstein, ""XBn" Barrier Photodetectors for High Sensitivity and High Operating Temperature Infrared Sensors", Proc. of SPIE, 2008, vol. 6940, pp. 69402U-1-69402U-12.

Maimon, S. et al., Appl. Phys. Lett., vol. 89, No. 15, Oct. 10, 2006, p. 151109.

Savich, G. R. et al., Appl. Phys. Lett., Sep. 22, 2011, vol. 99, 121112.

Tennant, W. E., J. Electronic Materials, Feb. 6, 2010, vol. 39, No. 7, 1030.

Ting et al., Appl. Phys. Lett., vol. 95, Jul. 16, 2009, 023508.

Wicks, G. W. et al., "Infrared detector epitaxial designs for suppression of surface leakage current", Proceedings of SPIE 7608, Jan. 23, 2010, 760822.

Carras et al., "Generation-recombination reduction in InAsSb photodiodes", Semiconductor Science and Technology, Nov. 9, 2006, vol. 21, pp. 1720-1723.

Hoffman et al., "The effect of doping the M-barrier in very long-wave type II in As/GaSb heterodiodes", Applied Physics Letters, Jul. 23, 2008, vol. 93, 031107, 3 pgs.

Nguyen et al., "Dark current suppression in type II InAs/GaSb superlattice long wavelength infrared photodiodes with M-structure barrier", Applied Physics Letters, Oct. 18, 2007, vol. 91, 163511, 3 pgs.

Reverchon et al., "Design and fabrication of infrared detectors based on lattice-matched InAs0.91Sb0.09 on GaSb", Physica E 20, Jan. 2004, pp. 519-522.

International Preliminary Report on Patentability for International Application PCT/US2009/050268, Report dated Jan. 11, 2011, dated Jan. 20, 2011, 4 Pgs.

International Search Report and Written Opinion for International Application No. PCT/US2009/050268, Search completed Sep. 27, 2009, dated Oct. 7, 2009, 5 Pgs.

Arias et al., "HgCdTe dual-band infrared photodiodes grown by molecular beam epitaxy", J. Appl. Phys, Oct. 15, 1991, 70(8), pp. 4620-4622.

Blazejewski et al., "Bias-switchable dual-band HgCdTe infrared photodetector", J. Vac. Sci. Technol., Jul./Aug. 1992, B10(4), pp. 1626-1632.

Byun et al., "Heterojunction fabrication by selective area chemical vapor deposition induced by synchrotron radiation", Appl. Phys. Lett, Apr. 11, 1994, vol. 64, No. 15, pp. 1968-1970.

Magden, "Effects of Strain Release via Interfacial Misfit Arrays on the Optical Properties of GaSb/GaAs Heterojunctions", Senior Honors Thesis, 2012, 59 pgs.

Maimon et al., "InAsSb/GlaAlSb/InAsSb nBn IR detector for the 3-5µm", Abstract Book of the 11th International Conference on Narrow Gap Semiconductors, Buffalo, New York, 2003, p. 70.

Maimon et al., "nBn detector, an infrared detector with reduced dark current and higher operating temperatures", Applied Physics Letters, Oct. 10, 2006, vol. 89, pp. 1511091-1511093.

Nguyen et al., "Background limited long wavelength infrared type-II InAs/SaSb superlattice photodiodes operating at 110 K", Applied Physics Letter, Sep. 22, 2008, vol. 93, pp. 123502-1-123502-3.

Plis, E. et al., "Lateral diffusion of minority carriers in nBn based type-II InAs/GaSb strained layer superlattice detectors", Applied Physics Letters, Sep. 24, 2008, vol. 93, 123507.

Plis et al., "Lateral diffusion of minority carriers in InAsSb-based nBn detectors", Applied Physics Letters, Sep. 22, 2010, vol. 97, pp. 123503.

Reine et al., "Independently Accessed Back-to-Back HgCdTe Photodiodes: A New Dual-Band Infrared Detector", Journal of Electronic Materials, 1995, vol. 24, No. 5, pp. 669-679.

Reyner et al., "Characterization of GaSb/GaAs interfacial misfit arrays using x-ray diffraction", Applied Physics Letters, Dec. 8, 2011, vol. 99, pp. 231906-1-231906-3.

Rogalski, "Heterostructure infrared photovoltaic detectors", Infrared Physics & Technology, Feb. 18, 2000, vol. 41, pp. 213-238.

Sttenbergen, E. H. et al., Applied Physics Letters, vol. 99, Dec. 22, 2011, 1511009.

Tatebayashi et al., "Monolithically Integrated III-Sb-Based Laser Diodes Grown on Miscut Si Substrates", IEEE Journal of Selected Topics in Quantum Electronics, May/Jun. 2009, vol. 15, No. 3, pp. 716-723.

Ting, David Z. et al., Proceedings of SPIE, 2009, 7419, 74190B.

Ting et al., "A high-performance long wavelength superlattice complementary barrier infrared detector", Applied Physics Letters, Jul. 16, 2009, vol. 95, pp. 023508-1-023508-3.

Ting et al., "Exclusion, extraction, and junction placement effects in the complementary barrier infrared detector", Applied Physics Letters, Mar. 26, 2013, vol. 102, pp. 121109-1-121109-4.

Wang et al., "Strain relief at the GaSb/GaAs interface versus substrate surface treatment and AlSb interlayers thickness", Journal of Applied Physics, Jan. 19, 2011, vol. 109, pp. 023509-1-023509-6.

(56) References Cited

OTHER PUBLICATIONS

Weiss et al., "InAsSb-based XBnn bariodes grown by molecular beam epitaxy on GaAs", Journal of Crystal Growth, 2012, vol. 339, pp. 31-35.
Wicks et al., "Infrared detector epitaxial designs for suppression of surface leakage current", Proc. of SPIE, 2010, vol. 7608, pp. 760822-1-760822-8.
Wilk et al., "Type-II InAsSb/InAs strained quantum-well laser diodes emitting at 3.2um", Applied Physics Letters, Oct. 9, 2000, vol. 77, No. 15, pp. 2298-2300.
Zhang, "Continuous wave operation of InAS/InAsxsb1-x", Appl. Phys. Lett. Jan. 9, 1995, 66 (2), pp. 118-120.
Zhang, "InAs/InAsxSb1-x type-II superlattice Midwave Infrared Lasers", Antimonide-Related Strained-Layer Heterostructures, edited by M. O. Manasreh, Gordon and Breach Science Publishers, Amsterdam (1997), 10 pgs.
Zhou et al., "Molecular Beam Epitaxy of GaSb on GaAs Substrates with AlSb Buffer Layers", Chin. Phys. Lett., 2009, vol. 26, No. 1, pp. 01810-1-01810-3.
Carras et al., "Interface band gap engineering in InAsSb photodiodes", Applied Physics Letters 87, Sep. 1, 2005, pp. 102103-1-102103-3.
Gautam, N. et al., "Performance improvement of longwave infrared photodetector based on type-II InAs/GaSb superlattices using unipolar current blocking layers", Applied Physics Letters, Jun. 8, 2010, vol. 96, pp. 231107-1-231107-3.
Ghosh et al., "Fabrication of the SnS/ZnO heterojunction for PV applications using electrodeposited ZnO films", Semicond. Sci. Technol., Jan. 20, 2009, vol. 24, pp. 025024-1-025024-7.
Gotoh et al., "Molecular Beam Epitaxy of AlSb on GaAs and GaSb on AlSb Films", Phys. Stat. Sol., 1983, vol. 75, pp. 641-645.
Hill, Cory et al., "Demonstration of large format mid-wavelength infrared focal plane arrays based on superlattice and BIRD detector structures", Infrared Physics & Technology, 2009, vol. 52, pp. 348-352.
Hoglund, L. et al., Applied Physics Letters, vol. 103, Nov. 26, 2013, 221908.
Huang et al., "Epitaxial growth and characterization of InAs/GaSb and InAs/InAsSb type-II superlattices on GaSb substrates by metalorganic chemical vapor depositions for long wavelength infrared photodetectors", Journal of Crystal Growth, 314, 2011, pp. 92-96.
Huang et al., "Strain relief by periodic misfit arrays for low defect density GaSb on GaAs", Applied Physics Letters, Mar. 30, 2006, vol. 88, pp. 131911-1-131911-3.
Johnson et al., "Electrical and optical properties of infrared photodiodes using the InAs/Ga1-xInXSb superlattice in heterojunctions with GaSb", J. Appl. Phys., Jul. 15, 1996, 80(2), pp. 1116-1127.
Kazzi et al., "Interplay between Sb flux and growth temperature during the formation of GaSb islands on GaP", Journal of Applied Physics, Jun. 19, 2012, vol. 111, pp. 123506-1-123506-5.
Khoshakhlagh, A. et al., "Bias dependent dual band response from InAs/Ga(In)Sb type II strain layer superlattice detectors", Applied Physics Letters, Dec. 27, 2007, vol. 91, 263504.
Khoshakhlagh et al., IEEE Journal of Quantum Electronics, vol. 46, No. 6, Jun. 6, 2010, pp. 959-964.
Kim et al., "Long-wave infrared nBn photodetectors based on INAs/InAsSb type-II superlattices", Applied Physics Letters, Oct. 18, 2012, 101, pp. 161114-1-161114-3.
Kim et al., "Mid-IR focal plane array based on type-II InAs/GaSb strain layer superlattice detector with nBn design", Applied Physics Letters, May 7, 2008, vol. 92, pp. 183502-1-183502-3.
Klipstein, P. et al., J. Proc. SPIE, vol. 7608, 2010, 76081 V-76081V-10.
Lackner et al., "Growth of InAsSb/InAs MQWs on GaSb for mid-IR photodetector applications", Journal of Crystal Growth, May 5, 2009, vol. 311, pp. 3563-3567.
Lackner et al., "InAsSb and InPSb Materials for Mid Infrared Photodetectors", Proceedings, 2010, IPRM, 4 pgs.
Lackner et al., "Strain balanced InAs/InAsSb superlattice structures with optical emission to 10 um", Applied Physics Letters, Aug. 26, 2009, vol. 95, pp. 081906-1-081906-3.
Lin et al., Y., "Minority Carrier Lifetime in Beryllium-Doped InAs/InAsSb Strained Layer Superlattices", Jun. 3, 2014, Journal of Electronic Material, vol. 43, No. 9, pp. 3184-3190.

\* cited by examiner

Prior Art

Prior Art

ENHANCED QUANTUM EFFICIENCY BARRIER INFRARED DETECTORS

STATEMENT OF RELATED APPLICATIONS

The current application claims priority to U.S. Provisional Application No. 62/265,813, filed Dec. 10, 2015, the disclosure of which is incorporated herein by reference.

STATEMENT OF FEDERAL FUNDING

The invention described herein was made in the performance of work under a NASA contract NNN12AA01C, and is subject to the provisions of Public Law 96-517 (35 USC 202) in which the Contractor has elected to retain title.

FIELD OF THE INVENTION

The current invention is directed to unipolar barrier infrared detectors and methods of their manufacture.

BACKGROUND OF THE INVENTION

The most successful infrared detector material to date is HgCdTe (MCT), which can be grown on nearly-lattice-matched CdZnTe (CZT) substrate with long minority carrier lifetimes and high absorption coefficients, and provides continuous cutoff wavelength coverage from the short-wavelength infrared (SWIR) to the long-wavelength infrared (LWIR) and beyond. III-V materials are robust and affordable, although detectors based on lattice-matched bulk III-V semiconductor absorbers are limited to the few SWIR and mid-wavelength infrared (MWIR) cutoff wavelengths offered by InGaAs (on InP substrate), InAs, InAsSb (on GaSb substrate), and InSb. In principle, varying the composition of InAsSb absorber allows for continuous cutoff wavelength coverage from the MWIR to the LWIR, but this typically involves metamorphic growth on custom compositionally graded buffer layers to minimize dislocation density due to lattice-mismatch to substrate. The ultimate performance of detectors based on longer cutoff wavelength metamorphic InAsSb, which has large lattice-mismatch to substrate, remains to be seen.

Recently, nearly-lattice-matched or pseudomorphically-grown III-V semiconductor type-II superlattices (T2SL's) such as InAs/GaSb, InAs/GaInSb, and InAs/InAsSb have emerged as viable alternatives to MCT for infrared detection. T2SL's can provide continuously adjustable cutoff wavelength, ranging from the SWIR to the very long-wavelength infrared (VLWIR). Favorable T2SL properties for infrared detection include lower susceptibility to band-to-band tunneling than bulk semiconductors and the capability for achieving reduced Auger recombination. Traditionally III-V infrared photodiodes tend to suffer from generation-recombination (G-R) and surface leakage dark currents. The recently emerged unipolar barrier device architecture such as the nBn, the XBn, the pBp, and the complementary barrier infrared detector (CBIRD) (See, e.g., S. Maimon and G. W. Wicks, Appl. Phys. Lett. 89(15) 151109 (2006); S. Maimon, U.S. Pat. No. 7,687,871 B2; P. Klipstein, U.S. Pat. No. 2009/0256231 A1 (2009); P. Klipstein, Proc. of SPIE. 6940 (2008) 69402U; and D. Z.-Y. Ting, et al., Appl. Phys. Lett. 95, 023508 (2009), the disclosures of each of which are incorporated herein by reference.) have provided an effective means for addressing these problems in some cases. A unipolar barrier blocks one carrier type (electron or hole) but allow the unimpeded flow of the other. The unipolar barrier photodetector architecture can be used to lower G-R dark current by suppressing Shockley-Read-Hall (SRH) processes, and can also be used to reduce surface leakage dark current in devices with n-type absorbers.

One concern for LWIR T2SL is the low hole mobility in the growth direction due to the very large hole effective masses; the resulting short diffusion length would lead to reduced collection quantum efficiency (QE). in n-type devices. T2SL detectors based on nBn and XBn detector architecture, which use n-type T2SL absorbers, can suffer from diminished QE as the cutoff wavelength increases. T2SL pBp detectors, which use p-type T2SL absorbers, have sufficient diffusion length to provide high QE. However, the pBp detectors can suffer from surface leakage dark current if not treated with proper surface passivation, which may not always be available. LWIR CBIRD with p-type T2SL can provide high QE and reduced surface leakage, but requires deep etch for detector array pixel isolation.

SUMMARY OF THE INVENTION

The disclosure is directed to barrier infrared detectors having enhanced quantum efficiency, and methods of their manufacture. In particular, the current disclosure demonstrates high-performance barrier infrared detectors using novel structures that incorporate a $p^+Bpnn^+$ structure.

Many embodiments are directed to detector structures including:
- a first contact layer formed from a highly doped p-type material, and a second contact layer formed from a highly doped n-type material;
- a unipolar electron barrier having first and second sides, and wherein the first side is disposed adjacent the first contact layer;
- a multi-segment absorber structure formed from at least a first absorber and a second absorber, and wherein the first absorber is formed from a p-type absorber material and is disposed adjacent the unipolar barrier, and wherein the second absorber is formed from an n-type absorber material and is disposed between the first absorber and the second contact layer; and
- wherein the valence band edges of the unipolar electron barrier and multi-segment absorber structure are configured to minimize offset therebetween.

In many other embodiments, the at least first and second absorbers are formed from bulk semiconductors, type-II superlattice materials, or a mixture thereof.

In still many other embodiments, the detector further includes at least one transition region being disposed between at least two individual segments of the detector selected from the group consisting of the first contact layer and the unipolar electron barrier, the unipolar barrier and the first absorber, the first absorber and the second absorber, and the second absorber and the second contact layer; and wherein the at least one transition region is configured to minimize offset between the band edges of the individual segments of the detector, and is formed of one of a graded-gap region, a graded-doping region, or a mixture thereof.

In yet many other embodiments, the detector includes at least one graded-gap transition region being disposed between one or both the unipolar barrier and the first absorber to minimize offset between their valence band edges, and the second absorber and the second contact layer to minimize offset between their conduction band edges.

In still yet many other embodiments, the graded-gap comprises a superlattice formed from a plurality of repeated layers of at least two semiconductor materials, each layer being defined by a layer thickness such that each superlattice has a period defined by the combined thicknesses of the plurality of repeated layers; and wherein the energy band structure of each superlattice including the band gap, conduction band edge and the valence band edge depends on the composition, thickness and period of the plurality of the repeated layers.

In still yet many other embodiments, the unipolar barrier is graded-gap material.

In still yet many other embodiments, the unipolar barrier is ungraded and further comprising at least one graded-gap transition region being disposed between the unipolar barrier and the first absorber, and configured to minimize offset between the valence band edges of the absorber and the unipolar barrier.

In still yet many other embodiments, the second absorber is formed from a graded-gap material.

In still yet many other embodiments, the first contact layer is the top contact and the second contact layer is the bottom contact.

In still yet many other embodiments, the first contact layer is the bottom contact and the second contact layer is the top contact.

In still yet many other embodiments, the band gaps of the contact layers, the first absorber, and the second absorber are the same.

In still yet many other embodiments, the band gaps of the contact layers, the first absorber and the second absorber are different.

In still yet many other embodiments, the band gaps of the contact layers are wider than the band gaps of the first and second layers.

Various embodiments are directed to a detector array including:
  a two-dimensional array of detector structures comprising:
    a first contact layer formed from a highly doped p-type material, and a second contact layer formed from a highly doped n-type material,
    a unipolar electron barrier having first and second sides, and wherein the first side is disposed adjacent the first contact layer,
    a multi-segment absorber structure formed from at least a first absorber and a second absorber, and wherein the first absorber is formed from a p-type absorber material and is disposed adjacent the unipolar barrier, and wherein the second absorber is formed from an n-type absorber material and is disposed between the first absorber and the second contact layer, and
  wherein the valence band edges of the unipolar electron barrier and multi-segment absorber structure are configured to minimize offset therebetween; and
  wherein the detector structures are mesa-isolated.

In various other embodiments, the first contact layer is the top contact, and wherein the individual detector structures are mesa-isolated by etching through the first contact layer, the unipolar barrier and the first absorber.

In still various other embodiments, the second contact layer is the top contact, and wherein the individual detector structures are mesa-isolated by etching through at least the second contact layer and the second absorber.

In yet various other embodiments, the second contact layer is the top contact, and wherein the individual detector structures are mesa-isolated by etching through the second contact layer, the second absorber and the first absorber, and at least partially through the unipolar barrier.

Some embodiments are directed to methods of forming a detector structure including:
  providing an absorber structure comprising at least a first absorber formed from a p-type absorber material disposed adjacent a second absorber formed from an n-type absorber material;
  interconnecting the first absorber to a unipolar electron barrier;
  connecting the ends of the unipolar barrier and the second absorber each to a separate contact layer;
  wherein the contact layer connected to the unipolar barrier is formed from a p-type material and wherein the contact layer connected to the second absorber is formed from an n-type material; and
  wherein the valence band edges of the unipolar barrier and first and second absorbers are configured to minimize offset therebetween.

In some other embodiments the method further includes inserting at least one transition region between at least one junction selected from the group consisting of: the junction between the first contact layer and the unipolar barrier, the junction between the unipolar barrier and the first absorber, the junction between the first absorber and the second absorber, and the junction between the second absorber and the second contact layer; and wherein the at least one transition region is configured to minimize offset between the band edges of the individual segments of the detector, and is formed of one of a graded-gap region, a graded-doping region, or a mixture thereof.

In still some other embodiments the method further includes forming one or both the unipolar barrier and the second absorber from a graded-gap material.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

These and other features and advantages of the present invention will be better understood by reference to the following detailed description when considered in conjunction with the accompanying data and figures, wherein.

DETAILED DESCRIPTION OF THE INVENTION

The current invention is directed to barrier infrared detectors having structures configured to enhance the quantum efficiency, and methods of their manufacture. In particular, the current invention provides device structures for constructing high-performance barrier infrared detectors using novel combinations of p-type and n-type absorber regions and contact regions. The infrared detectors may be referred to generically as a "p+Bpnn+" structure. In various embodiments, the detectors generally comprise, in sequence, a highly p-doped contact layer "p+", an electron unipolar barrier "B", a p-type absorber section "p", an n-type absorber section "n", and a highly n-doped contact layer "n+". Although many embodiments may include structures where the "p+" and "n+" layers are respectively the top and bottom contacts, i.e., with the "n+" contact being adjacent to the substrate, it should be understood that the reverse-sequence device structure, with the "p+" contact being adjacent to the substrate may also be implemented. Although not included in the brief structural description, it should be understood that various other embodiments may also incorporate transition or connection layers, which may be optionally inserted at some or all of the four interfaces in the "p+Bpnn+" structure, and which may include graded-gap or graded doping materials. In addition, regardless of the relative position of the two contacts and the presence or absence of transition or connection layers, embodiments may incorporate structures where the band gaps of the two contacts, the p-type absorber, and the n-type absorber are the same or different or a mixture thereof. In addition, many embodiments may implement an n-type absorber with a graded band gap to facilitate minority carrier (hole) transport. In various other embodiments, the "p+Bpnn+" structure maybe be viewed as a "p+pnn+" diode with an electron unipolar barrier inserted between the "p+" contact and the "p" absorber layer.

Figure 1:
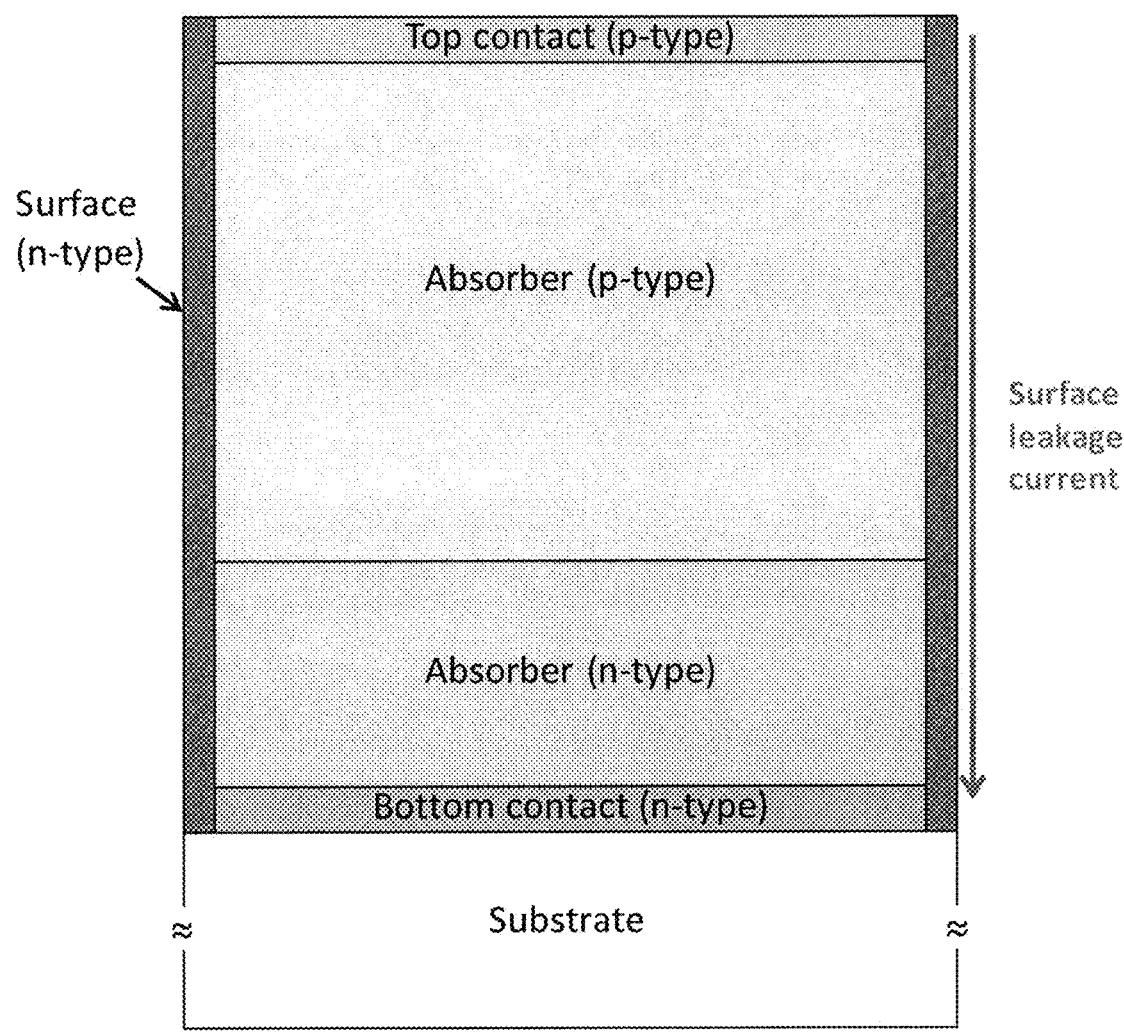
FIG. 1 provides a schematic illustration of a p-n junction infrared photodiode in accordance with the prior art, consisting of both p-type and n-type absorber regions surrounded by top and bottom contact layers, where electron surface leakage pathways connecting the top and bottom contacts are depicted along the n-type sidewalls of the diode as arrows.

Standard infrared photodetectors use the p-n junction diode architecture, schematically illustrated in FIG. 1. There are usually two major concerns when implementing a p-n junction photodiode using III-V semiconductor infrared absorbers: 1) generation-recombination (G-R) dark current, and, 2) surface leakage dark current. Generation-recombination dark current is due to Shockley-Read-Hall (SRH) processes in the depletion layer surrounding the p-n junction. Surface leakage in III-V semiconductor p-n junction infrared photodiodes frequently occurs when the surface conductivity type is entirely n-type, as illustrated in FIG. 1. Common examples are found in diodes with absorbers made from InAs or InAs-rich alloy semiconductors (or InAs/InAsSb T2SL), which have n-type surfaces even when they are doped p-type. An alternative detector design called the pBp can reduced G-R dark current, but still suffers from surface leakage if the surfaces of the p-type absorber inverts to n-type. (See, e.g., U.S. Patent Publication No. US 2009/0256231 A1 (2009), the disclosure of which is incorporated herein by reference.)

Figure 2:
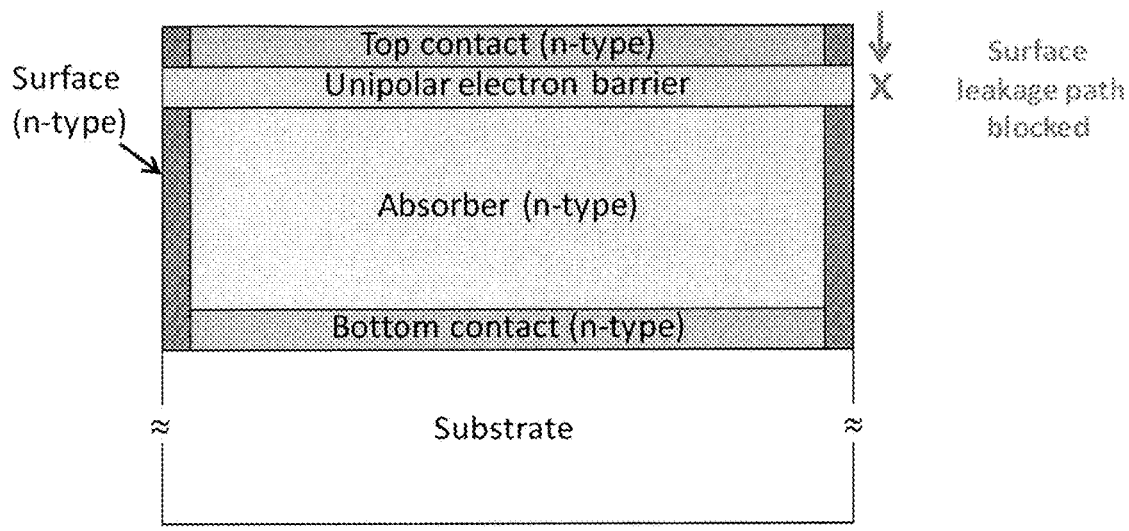
FIG. 2 provides a schematic illustration of an nBn infrared photodiode in accordance with the prior art, consisting of a unipolar electron barrier that is typically undoped or lightly doped, and an n-type absorber surrounded by top and bottom contact layers, where the electron surface leakage pathways along the sidewalls are blocked by the unipolar electron barrier.

The nBn photodetector architecture proposed and demonstrated by Maimon and Wicks provides an effective means for lowering G-R dark current by suppressing SRH processes, and for reducing surface leakage dark current. (See, e.g., S. Maimon and G. W. Wicks, *Appl. Phys. Lett.* 89(15) 151109 (2006); G. W. Wicks, G. R. Savich, J. R. Pedrazzani, S. Maimon, *Proc. of SPIE* 7608, 760822 (2010); and G. R. Savich, J. R. Pedrazzani, D. E. Sidor, S. Maimon, and G. W. Wicks, *Appl. Phys. Lett.* 99, 121112 (2011), the disclosures of which are incorporated herein by reference.) As illustrated in FIG. 2, the electron surface leakage pathway along the n-type surface is disrupted by the unipolar electron barrier, and therefore surface leakage current is suppressed. Since III-V semiconductors traditionally tend to suffer from having short SRH minority carrier lifetimes and the lack of good surface passivation, the unipolar barrier properties have been especially beneficial for III-V semiconductor based infrared photodiodes.

The general concept of type-II superlattice (T2SL) "barrier infrared detector" (BIRD), which generally consists of superlattice infrared absorber(s) paired with matching unipolar barrier(s), has previously been disclosed. (See, U.S. Pat. No. 8,217,480, the disclosure of which is incorporated herein by reference.) Among a number of exemplary structures disclosed in the patent was an nBn detector with an InAs/InAsSb T2SL absorber. Among the many advantages of the InAs/InAsSb T2SL absorber is that its bandgap can be adjusted continuously to provide cutoff wavelengths ranging from approximately 4 µm to beyond 15 µm, thereby providing a high degree of versatility. However, a major disadvantage is that the hole mobility of the T2SL can become quite low as the cutoff wavelength increases, particularly into the long-wavelength infrared (LWIR). As a result, LWIR detectors using n-type T2SL absorbers (such as those based on the nBn device architecture) have short diffusion lengths, which limits the absorber thickness, and in turn limits the quantum efficiency (QE). It was also shown that grading the absorber band gap can assist the collection of minority carriers (holes). While this can enhance the QE to some extent, it has been found to be inadequate in the case of LWIR detectors.

Figure 3:
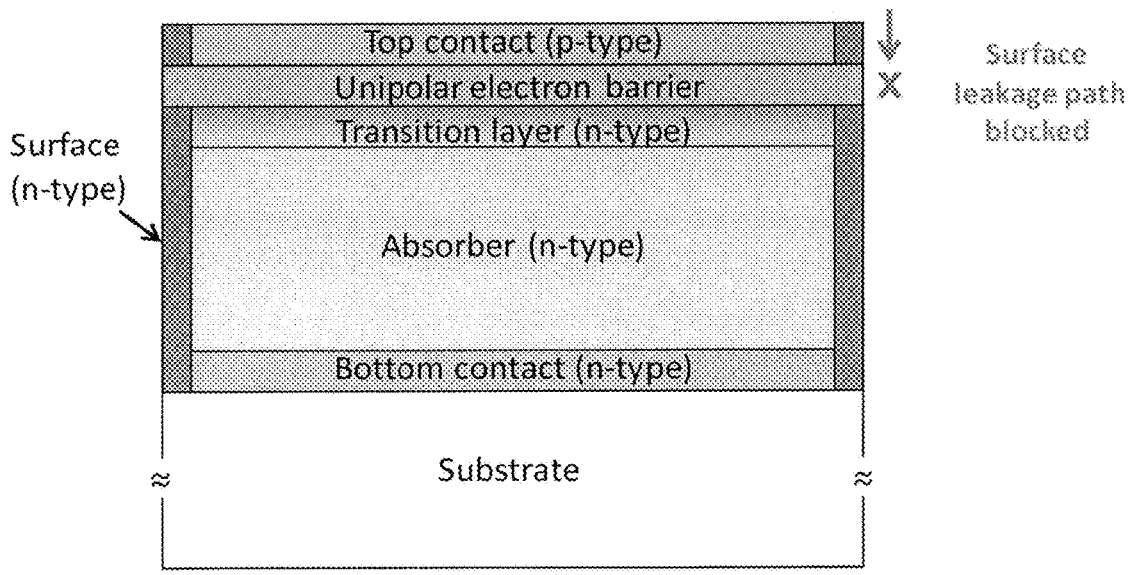
FIG. 3 provides a schematic illustration of a pBn infrared photodiode in accordance with the prior art, consisting of a unipolar electron barrier and n-type absorber region surrounded by top and bottom contact layers having a thin transition layer interposed between the barrier and the absorber, where the electron surface leakage pathways along the sidewalls are blocked by the unipolar electron barrier.

A device building blocks approach to constructing high-performance barrier infrared detectors has also been described. (See, e.g., U.S. patent application Ser. No. 14/216,932.) Among the exemplary devices is the pBn detector structure, in which the p-type top contact is made from a semiconductor having a larger band gap than the n-type absorber, and the valence band edge the unipolar electron barrier is matched to that of the top contact. In this case a graded-gap transition layer is used to minimize the offset between the valence-band edges of the absorber and the unipolar electron barrier, as illustrated in FIG. 3. The structure also benefits from surface leakage suppression, but the QE of LWIR detector based on this device design is also limited by the low hole mobility in the n-type absorber.

In summary, III-V semiconductor type-II superlattice (T2SL) long wavelength infrared (LWIR) detectors based on standard p-n junction device design can achieve high quantum efficiency, but have poor dark current performance. T2SL LWIR detectors based on nBn or pBn device architecture can achieve good dark current performance but do not have adequate quantum efficiency. The $p^+Bpnn^+$-based T2SL LWIR detectors in accordance with embodiments demonstrate both good dark current performance and good quantum efficiency.

Accordingly, to address the reduced LWIR quantum efficiency problem, embodiments are directed to $p^+Bpnn^+$ detector structures. One significant feature of the $p^+Bpnn^+$ disclosed is that the device has a unipolar barrier layer embedded in p-type material, and also incorporates an absorber having both p-type and n-type layers. There are no examples of infrared detector device structures in the literature that contain these basic features of the $p^+Bpnn^+$ device structure.

For example, Savich and co-workers (*Applied Physics Letters* 99, 121112 (2011)) disclose a device structure that bares superficial resemblance to the $p^+Bpnn^+$ structure, however, the device is merely a $p^+n$ diode with a unipolar electron barrier inserted into the "$p^+$" contact layer, i.e., a $p^+Bp^+n$ structure. As a result, unlike the $p^+Bpnn^+$ structure, which has both an n-doped and a p-doped absorber sections, the $p^+Bp^+n$ structure uses only an n-type absorber section limiting the uses to which the detector can be put. The opposite example was disclosed by Ashley and Elliott (*Semicond. Sci. Technol.* 6, pp. C99-C105 (1991)). This device is a $p^+Bpn^+$ structure, and has only a p-type absorber section. Finally, Lin et al. (US Patent Pub 2002/0027238) disclose a detector structure containing both n-type and p-type active absorber regions. However, this device is actually an $n^+B_nnpB_pp^+$ structure, containing a second hole unipolar barrier $B_n$ embedded in n-type material, and an electron unipolar barrier $B_p$ embedded in p-type material. In each device described by Lin et al, the unipolar barrier is inserted between a contact and an absorber layer in order to reduce the injection of minority carriers from the contact layer into the absorber layer. In contrast, the $p^+Bpnn^+$ structure differs in several respects: (1) It does not contain a unipolar hole barrier, (2) it reduces minority carrier injection by using highly-doped wider-band-gap contact layers with suppressed thermal generation, (3) the electron unipolar barrier is primarily used for the purposes of surface leakage current suppression. In short, none of these prior art devices provide structures equivalent in composition or function to the $p^+Bpnn^+$ device structure described. Nor are these devices configured to address the twin challenges of maximizing quantum efficiency while minimizing surface-leakage dark current.

Figure 4:
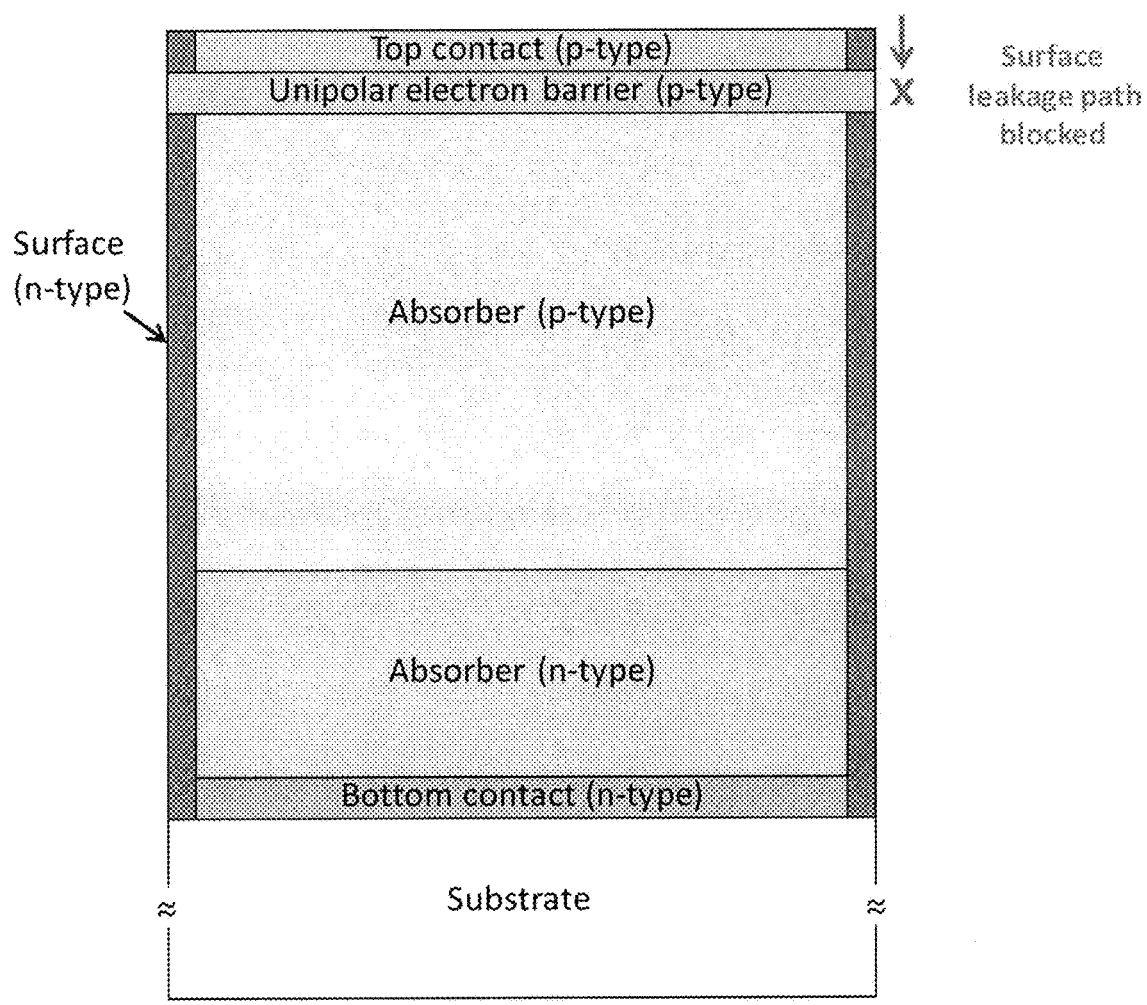
FIG. 4 provides a schematic illustration of a p+Bpnn+ infrared photodiode, in accordance with various embodiments, consisting of a unipolar electron barrier and p-type and n-type absorber regions surrounded by top and bottom contact layers, where the electron surface leakage pathways along the sidewalls are blocked by the unipolar electron barrier.

A schematic illustration of an exemplary p Bpnn$^+$ detector structure in accordance with embodiments is illustrated in FIG. 4. Although many variations of the basic design shown in FIG. 4 are possible, as illustrated, the generalized structure consists of, in order: a p-type contact layer/a unipolar electron barrier layer/an Absorber, which may be multi-segmented and formed of: a p-type Absorber and an n-type Absorber/an n-type contact layer. Although one specific detector structure is shown in FIG. 4 it will be understood that many variations of this generalized structure may be used. For example, as discussed above, optional graded transition layers may be incorporated between one or more of the above listed layers. Accordingly, although transition layers will be discussed in greater detail below, it will be understood that transition layers are not necessary. However, the structure in general includes doped top and bottom contact layers, an absorber structure that incorporates a p-type absorber (either monolithic or multi-segmented) and an n-type absorber (again either monolithic or multi-segmented), and a unipolar barrier layer (again either monolithic or multi-segmented) between the p-type contact and the p-type absorber.

Figure 5:
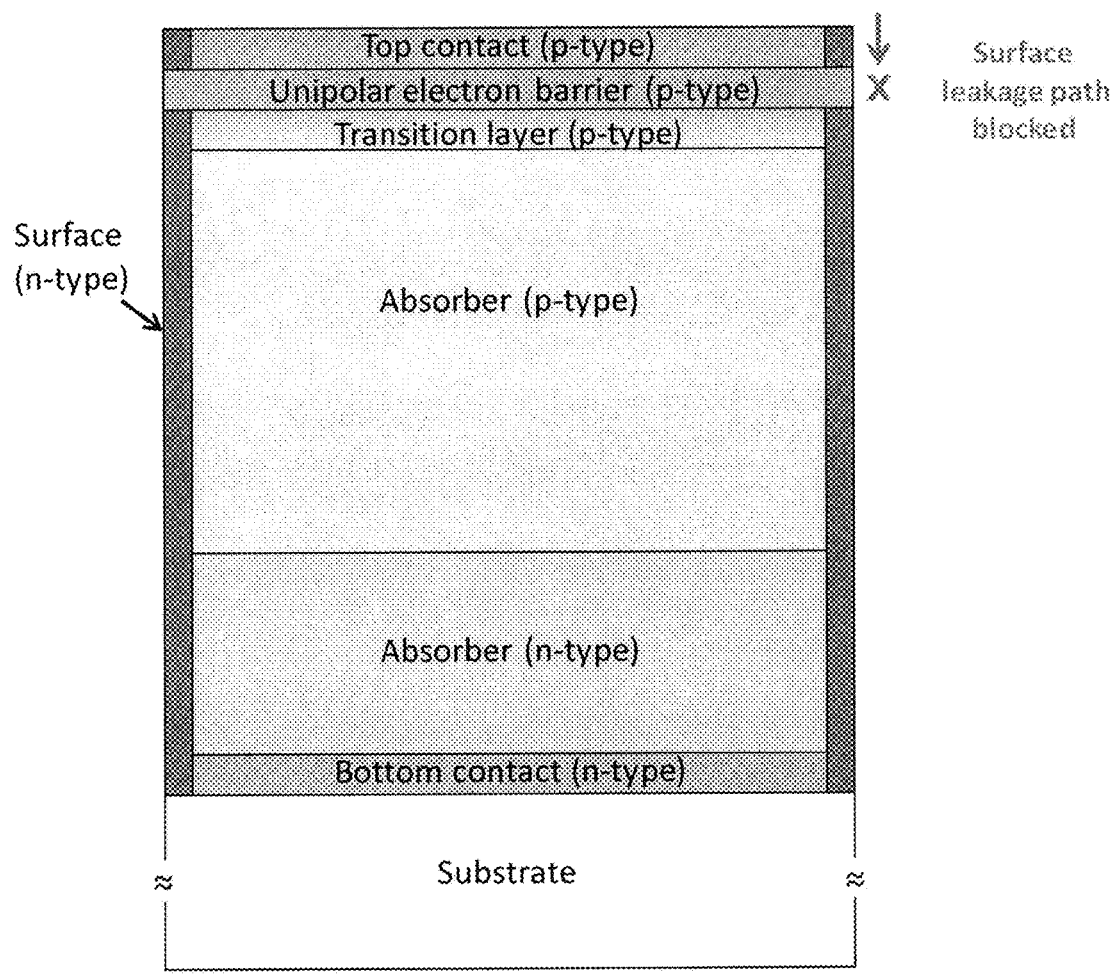
FIG. 5 provides a schematic illustration of a p+Bpnn+ infrared photodiode, in accordance with various embodiments, consisting of a unipolar electron barrier and p- and n-type absorber regions surrounded by top and bottom contact layers, and having a thin transition layer interposed between the barrier and the absorber, where the electron surface leakage pathways along the sidewalls are blocked by the unipolar electron barrier.

Alternative embodiments of the $p^+Bpnn^+$ device structure containing a p-type wider band gap top contact, a matching electron unipolar barrier, and an optional transition layer are illustrated in FIG. 5. As described above, more generally, transition or connection layers can optionally be inserted at some or all of the four interfaces in the $p^+Bpnn^+$ p-contact/electron-barrier/p-absorber/n-absorber/n-contact structure (FIG. 5). Such transition layers can be useful for the purposes of dark current reduction, facilitating carrier transport, and simplifying manufacturing.

Figure 6:
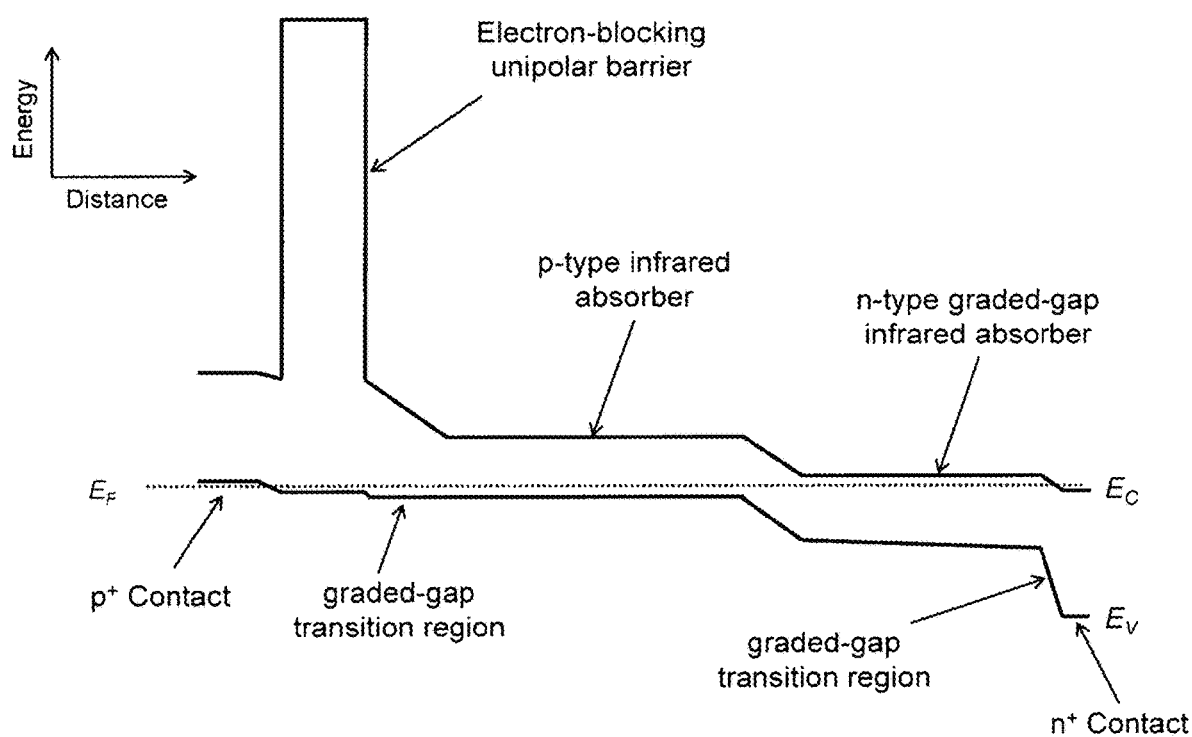
FIG. 6 provides a schematic energy band diagram of a p+Bpnn+infrared detector in accordance with embodiments of the invention.
Figure 7:
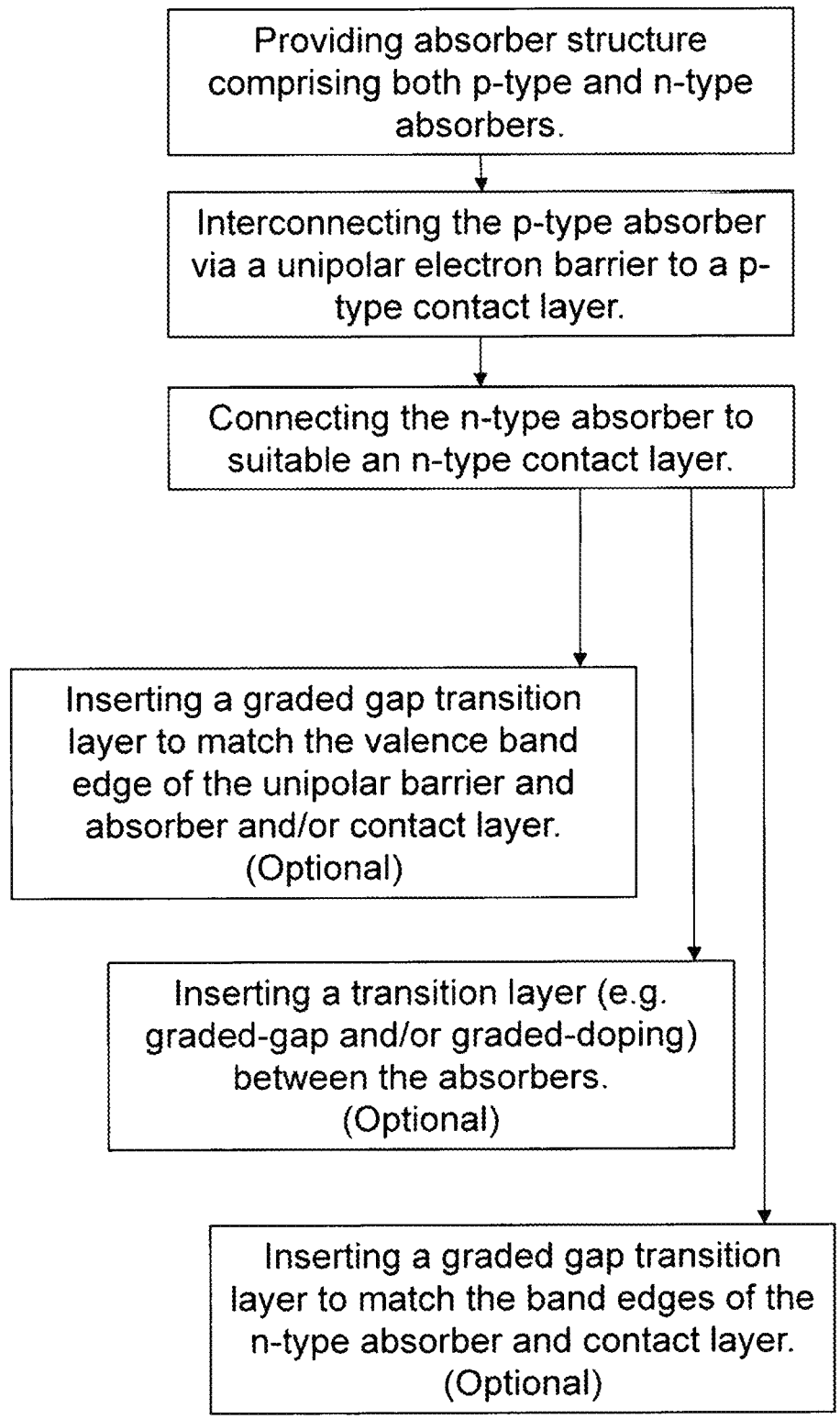
FIG. 7 provides a flow-chart of a process for forming p+Bpnn+ infrared detectors in accordance with embodiments of the current invention.

FIG. 6 provides a schematic energy band diagram of an exemplary $p^+Bpnn^+$ infrared detector in accordance with the embodiments described above. As shown, in embodiments the infrared absorber generally consists of an absorber with a p-type section and an n-type section. In many embodiments, the absorber may incorporate an n-type section having a graded band gap. Likewise, as shown, the $p^+$ and the $n^+$ contacts may both be made of materials that have wider band gaps than the absorber sections. As further shown, in various embodiments, graded gap transition regions may be introduced between the electron barrier and the p-type absorber, and between the n-type absorber and the $n^+$ contact. A transition layer with graded band gap and/or graded doping could also be introduced between the p-absorber and the n-absorber sections. Although a specific arrangement of layers is provided, it will be understood that these can be rearranged (such as by reversing the order of the structure) and supplemented (by, for example, the introduction or removal of one or more transition layers) as required.

Turning now to the structures of the various layers of the $p^+Bpnn^+$ detectors of the embodiments and their function, it should be understood that many suitable layers may be incorporated into the detectors.

In general, the absorber could be made from lightly doped (or un-intentionally doped) bulk semiconductors or type-II superlattices (T2SLs). In the case of the T2SL absorber, which tends to have lower hole mobility and therefore shorter diffusion length, it would be possible to grade the band gap (large band gap toward the $n^+$ contact end) of the n-type absorber section to create a quasi-electric field for facilitating hole transport (as shown in FIG. 6). In principle, the p-type section could also be graded, although this is normally not necessary since there is usually ample electron diffusion length. In general, the n-type and p-type absorbers do not have to have the same band gap.

In various embodiments, the $p^+$ and the $n^+$ contacts may be highly doped to provide good ohmic contact. Since minority carrier lifetime in highly doped regions is very short, most of the photo-generated carriers in highly doped contact regions are lost to rapid recombination, and will not contribute to photocurrent. Therefore, the contact layers are frequently made from materials with wider band gap(s) than the absorber sections, so that they may act as window layers such that they do not absorb photons near the detector absorption edge. The use of wider band gap contacts also decrease thermal carrier generation, and thereby reduce minority carrier injection into the absorber regions to minimize dark current. A wider band gap $n^+$ contact also serves to deflect holes in the n-type absorber traveling towards the $n^+$ contact region, in the same manner as a back-surface field (BSF) layer in a solar cell structure. (In this case the unipolar electron barrier acts as the BSF layer to electrons in the p-type absorber section.) In principle, the contact layers do not have to be highly doped, but such contacts would have relatively higher resistance, as well as higher thermal carrier generation.

Unlike the well-known "nBn" device described by Maim and Wicks in "nBn detector, an infrared detector with reduced dark current and higher operating temperature" [cited above], where the unipolar electron barrier is embedded in n-type material to block majority carriers (electrons), the unipolar electron barrier in embodiments of $p^+Bpnn^+$ detectors is embedded in p-type material. In such embodiments, the barrier should not block the flow of excess holes generated in the p-type absorber region to the $p^+$ contact layer, and therefore is usually doped p-type. A key function of the unipolar electron barrier is to block the flow of electrons between the p-type absorber layer and the $p^+$ contact layer. If the surface of the p-type absorber and p contact layer invert to n-type, the electron barrier can block the flow of surface leakage current. The barrier does not need to have uniform composition along the growth direction, and could have a graded band gap.

In other embodiments, as shown in FIGS. 5 and 6, transition or connection layers could be introduced to provide efficient removal of excess majority carriers generated in the absorber regions. For instance, a graded-gap transition layer could be inserted between the n-type absorber and the $n^+$ contact layer to minimize the offset between their conduction band edges, and provided an un-impeded path for electron flow from the n-type absorber to the $n^+$ contact. Similarly, a graded-gap transition layer could be inserted between the p-type absorber and the unipolar electron barrier to minimize the offset between their valence band edges, and provided an un-impeded path for holes to the $p^+$ contact layer. If necessary, additional transition layer could also be inserted between the unipolar electron barrier and the $p^+$ contact layer. A transition layer with a graded-gap and/or graded doping profile could also be introduced between the p-absorber and the n-absorber sections.

The structure and formation of grade-gap regions (e.g., transitions and/or barrier layers) in accordance with embodiments may be formed of superlattice structures. A superlattice structure generally comprises a plurality of layers of semiconducting materials disposed on a substrate (not shown). In these embodiments, the band structure is determined by the combination of the lowest conduction subband and the highest valence subband. In particular, the superlattice energy bandgap, is determined by the separation of the conduction and valence subbands at the zone center, and the band edge positions of the bands, which can be adjusted by varying the period of the superlattice. By varying the layer widths (period) and compositions within these superlattice structures a superlattice that has the desired band gap and a configuration that is minimally strained in relation to the underlying substrate may be engineered. Accordingly, in many embodiments of the graded-gap regions (including transition regions) the period of the superlattice structure may be configured to grade the transition between the unipolar barrier and the absorber. Accordingly, by chirping (gradually changing the period) of the superlattice it is possible to grade the band gap such that it interconnects the band edges of the smaller and larger band gap superlattices. The use of these superlattice structures and chirped superlattice structures allows for the facile construction of the graded-gap transition regions, because in such embodiments it is not necessary to change the composition of the bulk materials. In addition, the chirping may be accomplished while preserving strain-balancing throughout (i.e., the proportional stretching scheme preserves the strain balancing). (A full discussion of such superlattice structures may be found, for example, in U.S. Pat. No. 8,217,480 and U.S. patent application Ser. No. 14/216,932, the disclosures of which are incorporated herein by reference.)

Methods of Manufacturing Detectors

Although the above discussion has focused on detector devices formed with a $p^+Bpnn^+$ structure, many embodiments are also directed to methodologies of constructing detectors incorporating such structures.

Figure 9:
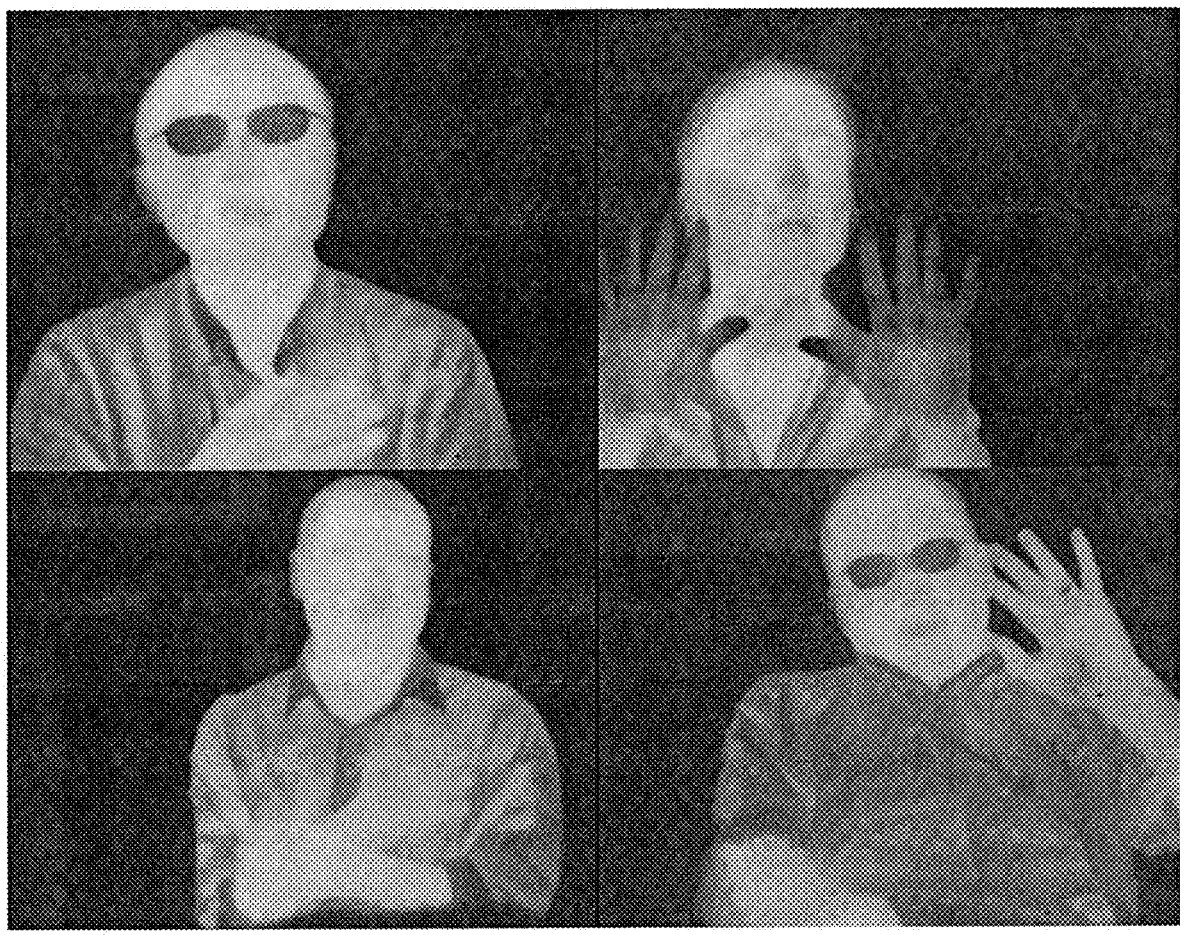
FIG. 9 provides a composite image taken using a photodetector array of p+Bpnn+ infrared detectors in accordance with embodiments of the current invention.

FIG. 9 provides a flow chart for such methodology, which, in many embodiments include at least the following processes:

Providing an absorber incorporating both p-type and n-type structures (e.g., where the absorber is multi-segmented thus having both n and p-type materials);

Interconnecting one end of the absorber with a unipolar barrier (graded or ungraded);

Connect the unipolar barrier and the opposite end of the absorber to suitable p and n-doped contact layers; and Inserting transition regions (e.g., graded-gap and/or constant gap and graded doping) as necessary between the various layers of the structure to match the valence band edges of the segments of the detectors to allow the formation of a variety of detectors across a wide-range of wavelengths.

Although the above steps provide embodiments of some basic processes for forming enhanced quantum efficiency $p^+Bpnn^+$ detectors, it should be understood that other steps may be incorporated into the process. For example, in some embodiments superlattice structures may be used in the absorber, barrier, transition or contact layers.

In embodiments, the thicknesses of the individual segments of the absorbers of the detectors are configured such that they are below the diffusion length of the absorber material.

With regard to specific growth and doping techniques, it will be understood that any suitable methods may be used, such as, for example, those described in U.S. Pat. No. 8,217,480.

Making use of the existing well-matched absorber and the electron barrier, and then using graded gap transition regions to minimize the offset between the valence band edge of the electron barrier block to that of the desired absorbers it is possible to construct many different detector architectures.

EXEMPLARY EMBODIMENTS

In this section, several examples of $p^+Bpnn^+$ barrier infrared detectors are provided. In addition, the performance of several embodiments of the detector are provided. The person skilled in the art will recognize that additional embodiments according to the invention are contemplated as being within the scope of the foregoing generic disclosure, and no disclaimer is in any way intended by these non-limiting examples.

Example 1: QE Study

As described above, the $p^+Bpnn^+$ structure in accordance with embodiments incorporates both a p-n diode (FIG. 1) and a unipolar electron barrier inserted between the p-type top contact and the p-type absorber layers of the p-n diode. The unipolar electron barrier serves to block surface leakage current path, as illustrated in FIGS. 4 and 5. This $p^+Bpnn^+$ structure benefits from QE contributions from both the p-type and the n-type absorber layers. To demonstrate the effectiveness of the $p^+Bpnn^+$ structure in QE enhancement, several example detectors were constructed and tested.

Figure 8:
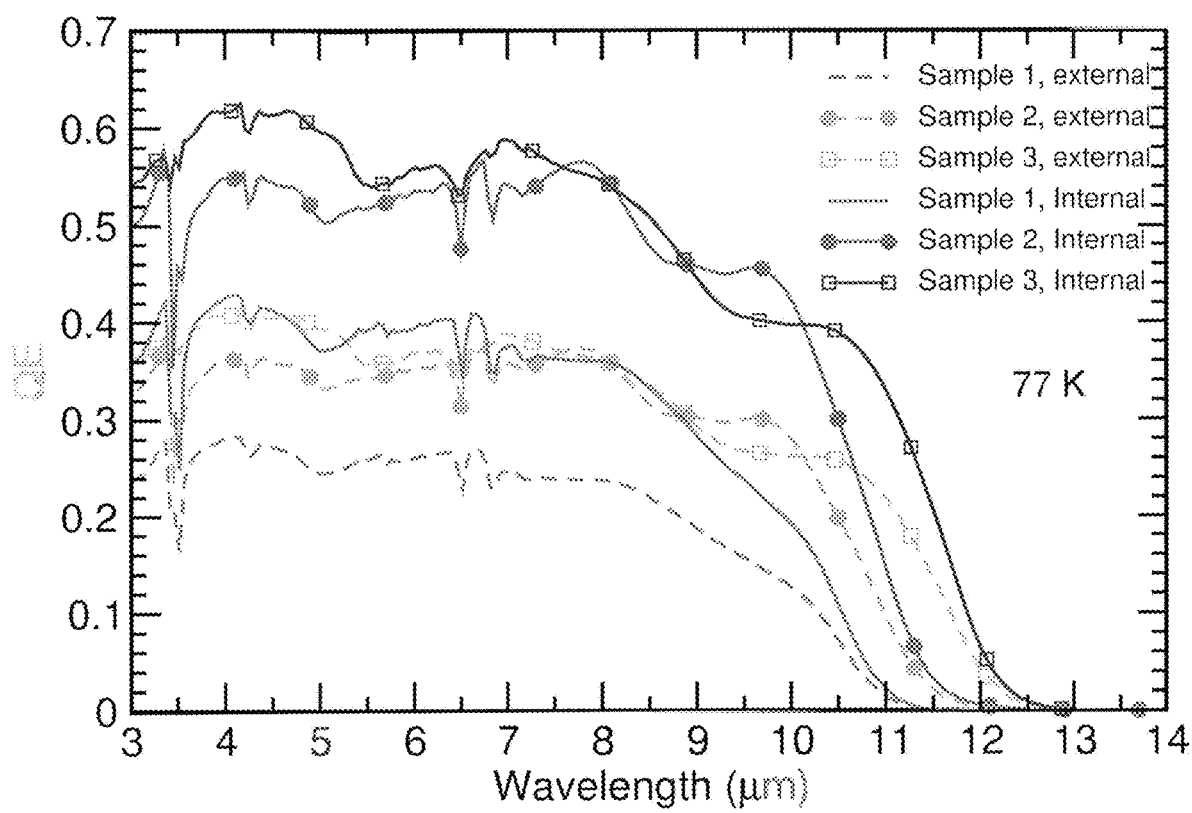
FIG. 8 provides back-side illuminated (through substrate) spectral quantum efficiency data for three samples, as measured (external; dashed lines) and corrected for surface reflection (internal; solid lines), where sample 1 has an n-type absorber region only, and samples 2 and 3 contain both p- and n-type absorber regions, in accordance with embodiments.

Example 1 is based on a prior art $p^+Bnn^+$ design as depicted in FIG. 3, with an n-type T2SL absorber layer that has a partially graded band gap. Examples 2 and 3 are based on embodiments of the $p^+Bpnn^+$ design depicted in FIG. 5, with a graded-band-gap n-type T2SL absorber layer and a constant band gap p-type absorber layer. The measured QE spectra are shown in FIG. 8 (dashed lines, labeled "external"). The $p^+Bpnn^+$-based detectors (Examples 2 and 3) show noticeably higher QE than the conventional $p^+Bnn^+$-based detector (Example 1). The example detectors do not have anti-reflection coating, therefore a significant fraction (approximately ⅓) of incident light can be reflected before entering the detector. The solid lines (label "internal") show the QE spectra corrected for surface reflection effect. It is noted that the thickness of the p-type absorber layer in Examples 2 and 3 is significantly smaller than the electron diffusion length, therefore their QE can be improved further by increasing the p-type absorber thickness.

Table 1 (below) shows the external QE (taken at 8 μm; without correcting for surface reflection effect), cutoff wavelength, and dark current density values for the three samples. Since the cutoff wavelengths for the three examples differ somewhat, the dark current density values ($J_d$) was normalized with respect to Rule 07 predictions ($J_{d,\ Rule\ 07}$) to facilitate comparison. (See, W. E. Tennant, *J. Electronic Materials* 39 (7), 1030 (2010), the disclosure of which is incorporated herein by reference.) Rule 07 is a convenient rule of thumb for estimating the dark current density for state-of-the-art infrared photodiodes; typically a detector with dark current density less than 10 times the Rule 07 value is considered to have good dark current performance. Examples 1, 2, and 3 all fall in that category. For comparison, results are also included for Example 4, which is an LWIR detector based on the simple (no unipolar barriers) p-n junction design with a p-type absorber section only. Like Examples 2 and 3, Sample 4 has higher QE than Example 1, but Example 4 has very high dark current density (attributed to surface leakage) when compared to Rule 07.

TABLE 1

Device Properties

| Sample No. | Design | Temperature [K] | QE @ λ = 8 μm | Cutoff Wavelength [μm] | Dark Current Density ($J_d$) [A/cm$^2$] | $J_d/J_{d,\ Rule'07}$ |
|---|---|---|---|---|---|---|
| 1 | $p^+Bnn^+$ | 77 | 23.7% | 10.3 | $3 \times 10^{-5}$ | 9 |
| 2 | $p^+Bpnn^+$ | 77 | 36.6% | 10.8 | $6 \times 10^{-5}$ | 4.2 |
| 3 | $p^+Bpnn^+$ | 77 | 36% | 11.6 | $1 \times 10^{-4}$ | 1.8 |
| 4 | $p^+pn^+$ | 77 | 43% | 9.1 | $2 \times 10^{-3}$ | 5,560 |

The fact that the p $Bpnn^+$-based detectors have higher QE than the $p^+Bnn^+$-based detector is as intended by design; they benefit from having extra QE contributions from the added p-type absorber layer. What is unexpected is that their dark current densities remain as low as the $p^+Bnn^+$ structure despite the presence of the p-n junction. In the simple p-n junction design the largest dark current contribution is from surface leakage (as in Example 4). Here both the $p^+Bnn^+$ and the $p^+Bpnn^+$ benefit from surface leakage current blocking from the unipolar electron barrier, as illustrated in FIGS. 3, 4, and 5; the worst dark current offender is already eliminated in both cases. However, it would still be normally expected to find larger G-R dark current in the $p^+Bpnn^+$ structure, where depletion surrounding the pn junction (below the barrier) can be significant, making these results significant and surprising.

Example 2: Detector Arrays

It is unusual for a detector structure to have both p- and n-type absorber regions. The typical p-n junction photo diode uses either n-type or p-type absorber only. However, there are circumstances where having both types of absorber regions is desirable, as illustrated by the following example.

An imaging focal plane array can be fabricated by forming a two-dimensional array of mesa-isolated photodetectors. In delineating pixels on p-n junction photodiode material, the mesa etch depth should exceed the depth of the p-n junction to provide electrical isolation among the individual photodiodes. In certain semiconductor absorbers, such as InAs, InAs-rich alloys, and InAs/InAsSb T2SL, the surface conductivity is always n-type, regardless of whether the semiconductor is doped n-type or p-type. Making an imaging focal plane array using such p-n junction photodiode material is challenging since the n-type surface of the exposed mesa sidewalls electrical connect the individual diodes that should be isolated. Although in principle this problem can be solved by using surface passivation that prevents the surface of p-type semiconductor from inverting to n-type, such surface passivation is not always available.

The $p^+Bpnn^+$ structure circumvents this problem by using the electron unipolar barrier "B" layer to disrupt the continuity of the n-type surface, and thereby provides diode isolation without surface passivation.

Accordingly, the $p^+Bpnn^+$ structure can be used to fabricate imaging focal plane arrays. The pixels in a detector array are electrically isolated by etching trenches to delineated individual mesas. To delineated individual pixels in a detector array made from the $p^+Bpnn^+$ structure, the etch depth must exceed the depth of the p-n junction. For implementations where it is desirable to minimize the etch depth to reduce fabrication challenges, the n-type absorber layer thickness could be made comparable to the hole diffusion length to maximize the QE contribution from the n-type absorber region (i.e., as thick as possible without degrading the QE), while the p-type absorber layer would have the minimum thickness necessary to achieve the desired overall QE level (i.e., as thin as needed to make up for the needed QE not provided by the n-type absorber layer).

For a p$^+$Bpnn$^+$ device with the n$^+$ layer as the bottom contact (on the substrate side), we need to etch through the p$^+$, B, and p layers, and past the p-n junction for pixel delineation. For the reverse sequence n$^+$npBp$^+$ structure with the p$^+$ layer as the bottom contact it would be necessary to etch through the n$^+$ and n layers, and past the n-p junction for pixel delineation. However, this would not work if the surface of the p layer inverts to n-type, and thereby providing a low-impedance surface leakage current path connecting different mesa contacts. In that case, it would be necessary to further etch into or past the B layer to provide electrical isolation of the individual pixels.

To demonstrate the performance potential of detector arrays incorporating the p$^+$Bpnn$^+$ detectors, four images taken using an exemplary detector array made in accordance with embodiments is provided in FIG. 9. The exemplary detector array format is 320×256, with 30-μm pixel pitch. The absorber used in the exemplary array is based on InAs/InAsSb T2SL, and the cutoff wavelength of the detector array is 13.3 μm. The images were taken with F/5 optics, while the focal plane array operated at a temperature of 69K. The challenges associated with making focal-plane arrays with such very long cutoff wavelengths are well known. The image qualities based on the p$^+$Bpnn$^+$ detector architecture, in accordance with embodiments, are very good. In the results provided, the detector array was not intentionally passivated. An InAs/InAsSb T2SL based on the simple pn-junction device architecture would exhibit very large surface leakage current, since p-type InAs/InAsSb T2SL material exhibits surface inversion to n-type. Here, as demonstrated, the surface leakage current is strongly suppressed.

SUMMARY

In summary, a highly manufacturable infrared detector incorporating quantum efficiency enhancing p$^+$Bpnn$^+$ structures have been described. In particular, detectors formed with multi-segmented absorber sections are provided. Using these structures, examples of high-performance infrared detectors have also been described.

Although specific examples of p$^+$Bpnn$^+$ detectors are described above, it should be understood that the same construction may be used to form other detector structures in accordance with other embodiments.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A detector structure comprising:
   a first contact layer formed from a p-type doped material, and a second contact layer formed from an n-type doped material, wherein at least the second contact layer does not include a hole blocking structure;
   a unipolar electron barrier having first and second sides, and wherein the first side is disposed adjacent the first contact layer; and
   a multi-segment absorber structure formed from at least a first absorber and a second absorber, wherein the first absorber is formed from a p-type absorber material and is disposed adjacent the second side of the unipolar electron barrier, and wherein the second absorber is formed from an n-type absorber material and is disposed between the first absorber and the second contact layer;
   wherein the second absorber is connected to the second contact layer either directly or by a transition region, wherein where a transition region is present the transition region is directly connected at a first side to the second contact layer and at a second side to the second absorber; and
   wherein the valence band edges of the unipolar electron barrier and multi-segment absorber structure are configured to minimize offset therebetween.

2. The detector structure of claim 1, further comprising at least one transition region being disposed between at least two individual segments of the detector selected from the group consisting of the first contact layer and the unipolar electron barrier, the unipolar electron barrier and the first absorber, the first absorber and the second absorber, and the second absorber and the second contact layer; and
   wherein the at least one transition region is configured to minimize offset between the band edges of the individual segments of the detector, and is formed of one of the graded-gap region, a graded-doping region, or a mixture thereof.

3. The detector structure of claim 2, further comprising at least one graded-gap transition region being disposed between one of, or both, the unipolar electron barrier and the first absorber to minimize offset between their valence band edges, and the second absorber and the second contact layer to minimize offset between their conduction band edges.

4. The detector structure of claim 2, wherein the graded-gap comprises a superlattice formed from a plurality of repeated layers of at least two semiconductor materials, each layer being defined by a layer thickness such that each superlattice has a period defined by the combined thicknesses of the plurality of repeated layers; and
   wherein the energy band structure of each superlattice including the band gap, conduction band edge and the valence band edge depends on the composition, thickness and period of the plurality of the repeated layers.

5. The detector structure of claim 1, wherein the at least first and second absorbers are formed from bulk semiconductors, type-II superlattice materials, or a mixture thereof.

6. The detector structure of claim 1, wherein the unipolar electron barrier is graded-gap material.

7. The detector structure of claim 1, wherein the unipolar electron barrier is ungraded and further comprising at least one graded-gap transition region being disposed between the unipolar electron barrier and the first absorber, and configured to minimize offset between the valence band edges of the absorber and the unipolar electron barrier.

8. The detector structure of claim 1, wherein the second absorber is formed from a graded-gap material.

9. The detector structure of claim 1, wherein the first contact layer is the top contact and the second contact layer is the bottom contact.

10. The detector structure of claim 1, wherein the first contact layer is the bottom contact and the second contact layer is the top contact.

11. The detector structure of claim 1, wherein the band gaps of the contact layers, the first absorber, and the second absorber are the same.

12. The detector structure of claim 1, wherein the band gaps of the contact layers, the first absorber, and the second absorber are different.

13. The detector structure of claim 1, wherein the band gaps of the contact layers are wider than the band gaps of the first and second absorbers.

14. A detector array comprising:
a two-dimensional array of detector structures comprising:
   a first contact layer formed from a p-type doped material, and a second contact layer formed from an n-type doped material, wherein at least the second contact layer does not include a hole blocking structure,
   a unipolar electron barrier having first and second sides, and wherein the first side is disposed adjacent the first contact layer, and
   a multi-segment absorber structure formed from at least a first absorber and a second absorber, wherein the first absorber is formed from a p-type absorber material and is disposed adjacent the second side of the unipolar electron barrier, and wherein the second absorber is formed from an n-type absorber material and is disposed between the first absorber and the second contact layer,
   wherein the second absorber is connected to the second contact layer either directly or by a transition region, wherein where a transition region is present the transition region is directly connected at a first side to the second contact layer and at a second side to the second absorber; and
   wherein the valence band edges of the unipolar electron barrier and multi-segment absorber structure are configured to minimize offset therebetween; and
   wherein the detector structures are mesa-isolated.

15. The detector array of claim 14, wherein the first contact layer is the top contact, and wherein the individual detector structures are mesa-isolated by etching through the first contact layer, the unipolar electron barrier and the first absorber.

16. The detector array of claim 14, wherein the second contact layer is the top contact, and wherein the individual detector structures are mesa-isolated by etching through at least the second contact layer and the second absorber.

17. The detector array of claim 14, wherein the second contact layer is the top contact, and wherein the individual detector structures are mesa-isolated by etching through the second contact layer, the second absorber and the first absorber, and at least partially through the unipolar electron barrier.

* * * * *